(12) United States Patent
Brengartner et al.

(10) Patent No.: US 9,971,855 B2
(45) Date of Patent: May 15, 2018

(54) METHOD FOR DETERMINING AND OR MONITORING AT LEAST ONE PARAMETER IN AUTOMATION TECHNOLOGY

(71) Applicant: Endress + Hauser GmbH + Co. KG, Maulburg (DE)

(72) Inventors: Tobias Brengartner, Emmendingen (DE); Gerd Bechtel, Steinen (DE); Michael Siegel, Karlsruhe (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 333 days.

(21) Appl. No.: 14/652,702

(22) PCT Filed: Dec. 6, 2013

(86) PCT No.: PCT/EP2013/075767
§ 371 (c)(1),
(2) Date: Jun. 16, 2015

(87) PCT Pub. No.: WO2014/095418
PCT Pub. Date: Jun. 26, 2014

(65) Prior Publication Data
US 2016/0188766 A1      Jun. 30, 2016

(30) Foreign Application Priority Data

Dec. 21, 2012   (DE) ........................ 10 2012 113 045

(51) Int. Cl.
*G06F 17/50*    (2006.01)
*G05B 13/04*    (2006.01)
*G06F 17/10*    (2006.01)

(52) U.S. Cl.
CPC ....... *G06F 17/5009* (2013.01); *G05B 13/042* (2013.01); *G06F 17/10* (2013.01)

(58) Field of Classification Search
USPC ................ 703/2, 5, 6; 702/46, 150; 73/1.73, 73/661.357
See application file for complete search history.

(56) References Cited

U.S. PATENT DOCUMENTS 6,718,270 B2   4/2004   Horiuchi
6,813,895 B2   11/2004  Eisenhower
(Continued)

FOREIGN PATENT DOCUMENTS

EP    1986067 A1    10/2008
EP    2041529 B1    4/2009
(Continued)

OTHER PUBLICATIONS

R. E. Kalman, "A New Approach to Linear Filtering and Prediction Problems", Transactions of the ASME—Journal of Basic Engineering, 82 Series D, 1960; 35-45.
(Continued)

*Primary Examiner* — Thai Phan
(74) *Attorney, Agent, or Firm* — Bacon & Thomas, PLLC

(57) ABSTRACT

A method for determining and or monitoring at least one process- and/or system specific parameter in automation technology. An oscillatable system is provided, which interacts with a medium located in a container, wherein the oscillatable system is excited to oscillate via a real input signal, wherein the real output signal of the oscillatable system is ascertained, wherein the real output signal is digitized and a real output sequence yu(k) is produced. The real input signal is digitized and a digital input sequence (u(k)) is produced, wherein the digital input sequence (u(k)) is fed to a function block (model), which provides at least one mathematical model of the oscillatable system in interaction with the medium. The mathematical model is defined by a number of process- and/or system specific parameters, wherein via the mathematical model a virtual output (Continued)

sequence (ym(k)) is produced, wherein the virtual output sequence ym(k) is compared with the real output sequence yu(k). In the case of a deviation, at least one process- and/or system specific parameter of the mathematical model is adaptively changed, until the deviation between the virtual output signal and the real output signal of the oscillatable unit lies within a predetermined tolerance range and wherein at least one of the process- and/or system specific parameters is provided.

8 Claims, 3 Drawing Sheets

(56) References Cited

U.S. PATENT DOCUMENTS

| | | | |
|---|---|---|---|
| 7,356,427 B2 | 4/2008 | Dykstra | |
| 7,881,830 B2 | 2/2011 | Yasui | |
| 8,220,313 B2 | 7/2012 | Lopatin | |
| 2009/0228220 A1 | 9/2009 | Borgstadt | |
| 2009/0281764 A1* | 11/2009 | Raykhman | G01B 7/023 702/150 |
| 2010/0139417 A1* | 6/2010 | Kolahi | G01F 1/8495 73/861.357 |
| 2010/0241407 A1 | 9/2010 | Hsu | |
| 2013/0338943 A1* | 12/2013 | Kolahi | G01F 1/8436 702/46 |
| 2014/0236551 A1* | 8/2014 | Vold | G06F 17/5018 703/2 |
| 2014/0313559 A1* | 10/2014 | Lipson | G02B 6/29338 359/238 |
| 2016/0138964 A1* | 5/2016 | Brengartner | G01F 25/0061 73/1.73 |

FOREIGN PATENT DOCUMENTS

| | | |
|---|---|---|
| WO | 0231471 A2 | 4/2002 |
| WO | 2005026854 A1 | 3/2005 |
| WO | 2006072788 A2 | 7/2006 |
| WO | 2014095418 A1 | 6/2014 |

OTHER PUBLICATIONS

English Translation of the International Preliminary Report on Patentability, WIPO, Geneva, CH, dated Jul. 2, 2015.
German Search Report, German Patent Office, Munich, DE, dated Jul. 19, 2013.

* cited by examiner $x = c \cosh(\zeta) \cos(u)$
$y = c \sinh(\zeta) \sin(u)$ $c^2 = a^2 - b^2 \mid a > b$ $e^{\zeta_0} = \left(\dfrac{a+b}{a-b}\right)^{1/2}$ $a = c \cosh(\zeta_0)$
$b = c \sinh(\zeta_0)$ $u = $ const (hyperbolas)   $\zeta = $ const (ellipses)

The velocity potential around the elliptic cylinder is:

$\varphi = -u \cdot a \cdot e^{(\zeta_0 - \zeta)} \cdot \dfrac{\cos^2(u)}{\sin^2(u)}$

METHOD FOR DETERMINING AND OR MONITORING AT LEAST ONE PARAMETER IN AUTOMATION TECHNOLOGY

TECHNICAL FIELD

The invention relates to a method for determining and or monitoring at least one parameter, respectively a process variable, in automation technology, wherein an oscillatable system is provided, which interacts, at least at times, with a medium located in a container. The parameter, respectively process variable, is a process-, respectively system, specific parameter. Especially, system specific parameters deliver information concerning the geometry and/or the character of the oscillatable system.

BACKGROUND DISCUSSION

Vibronic sensors are finding increased application in automation technology, especially in process measurements technology, and even in manufacturing technology. The oscillatable element of a vibronic sensor is connected with a membrane by material bonding and can be embodied as an oscillatory fork or as a single rod. The membrane and the oscillatable element connected with the membrane are excited to oscillate via a transmitting/receiving unit. The transmitting/receiving unit is usually at least one piezoelectric, respectively electromechanical, element. Moreover, also known are so-called membrane oscillators, in the case of which the oscillatable element is the membrane.

Usually, a vibronic sensor is excited to oscillate via an analog electronics, wherein the analog electronics forms together with the sensor the analog oscillatory circuit. Corresponding vibronic sensors, respectively vibronic measuring devices, are manufactured and sold by the company, Endress+Hauser in varied embodiments under the marks LIQUIPHANT and SOLIPHANT.

Vibronic sensors enable detection of a process- or system specific parameter, such as the limit level of a liquid or a solid in a container. Usually, for detection of a predetermined fill level (limit level), the sensor is operated with the resonant frequency of the oscillatable system. By detecting the frequency change at the set phase of 90°, it can be recognized whether the oscillatable unit is in contact with the medium or is oscillating freely.

Moreover, it is known to evaluate the oscillatory behavior of vibronic sensors in a medium in order to ascertain, respectively to monitor, process- and/or system specific parameters. Process specific parameters include especially density and viscosity, however, also temperature. For the purpose of determining the density of a liquid medium, the phase difference (often also referred to simply as phase) between the input signal and the output signal is set to 45° or 135°. In setting this phase difference, a frequency change is uniquely attributed to a change of the density of the medium, since an influence of the viscosity of the medium can be excluded. Published International Application WO 02/031471 A2 describes an apparatus for viscosity measurement. European Patent EP 2 041 529 B1 teaches an apparatus for determining the density of a liquid medium.

As evident from the above mentioned examples, an analog electronics has the disadvantage that it is relatively inflexible. Especially, the analog electronics must be matched to each sensor, respectively sensor type, as a function of its oscillation characteristics and further as a function of the respective application—thus whether the sensor is to be applied for fill level-, density- or viscosity measurement.

SUMMARY OF THE INVENTION

An object of the invention is to provide a method making it possible to use an oscillatable sensor flexibly.

The object is achieved by a method for determining and or monitoring at least one process- and/or system specific parameter in automation technology, wherein an oscillatable system is provided, which interacts at least at times with a medium located in a container. The method of the invention includes method steps as follows:

the oscillatable system is excited to oscillate via a real input signal;

the real output signal of the oscillatable system is ascertained;

the real output signal is digitized and a real output sequence is produced;

the real input signal is digitized and a digital input sequence is produced;

the digital input sequence is fed to a function block, which provides at least one mathematical model of the oscillatable system in interaction with the medium, wherein the mathematical model is defined by a number of process- and/or system specific parameters;

via the mathematical model, a virtual output sequence is produced;

the virtual output sequence is compared with the real output sequence; in the case of a deviation, at least one process- and/or system specific parameter of the mathematical model is adaptively changed, until the deviation between the virtual output signal and the real output signal of the oscillatable unit lies within a predetermined tolerance range;

at least one of the process- and/or system specific parameters, respectively process variables, is provided.

The solution of the invention has a number of significant advantages compared with the previous solutions:

Via the method of the invention, it is no longer necessary to develop a suitable analog electronics for each sensor, respectively sensor type, for fill level measurement.

Furthermore, it is with the invention also no longer necessary to develop a suitable analog electronics for each sensor or sensor type in different applications—thus especially for density measurement and/or viscosity measurement, of which both are dependent on temperature.

All process- and/or system specific parameters, which are registrable with an oscillatable system, can be handled instead just with one digital electronics.

Moreover, all process- and or system specific parameters, which are registrable with an oscillatable system, can be registered simultaneously.

The method of the invention is integrateable without problem into a conventional electronics for an oscillatable system, e.g. for limit level detection.

The algorithms for determining the parameters to be monitored can be reused.

Core feature of the method of the invention is the application a mathematical model, which describes the oscillatory behavior of the oscillatable element of a vibronic sensor in the medium. The model building is especially takes into consideration the interaction between the oscillatable system, thus especially between the oscillatable element, and the fluid medium. This interaction causes, additionally acting on the oscillatable system, forces, which significantly influence the oscillatory behavior of the oscillatable system.

The forces, which influence the oscillatory behavior, are analytically calculated in the mathematical model, whereby it is possible to use known algorithms, such as e.g. parameter estimation methods or also adaptive rules, in order to obtain the desired information concerning at least one process variable to be determined.

In the following, the derivation of a mathematical model, which can be used in connection with the invention, will be described. Especially, it is assumed that the velocity potential $\varphi$ of an ideal fluid about a predetermined body is known.

The velocity of the fluid around the body results from the directional derivative of $\varphi$: $v=\Delta\varphi$).

The velocity $v$ of the ideal fluid is composed of a normal component n and a tangential component t:

$$v_{iF} = \underbrace{A \cdot u \cdot \vec{e}_n}_{v_{n,iF}} + \underbrace{B \cdot u \cdot \vec{e}_t}_{v_{t,iF}}$$

In such case, $\vec{e}_n$ and $\vec{e}_t$ are the unit vectors in the corresponding directions, u is the velocity of the body, and A and B describe geometric variables of the body.

The total force, which a viscous fluid exerts on a moving body, can be subdivided into two forces:
1. compressive force
2. frictional force 1. In order to be able to calculate the compressive force, the pressure can be calculated with the assistance of the Euler equation. Since the fluid velocity is not influenced by the viscosity of the fluid, the normal component of the velocity potential of an ideal fluid can be taken into consideration for calculating the pressure on the body surface (n=0). The pressure p on the body surface is then:

$$p\big|_{n=0} = -\rho \cdot \frac{\partial \varphi}{\partial u} \cdot \frac{\partial u}{\partial t}$$

For the calculating the compressive force, the pressure must then be integrated over the surface area of the body:

$$F_D = \int p\big|_{n=0} dA = \int -\rho \cdot \frac{\partial \varphi}{\partial u} \cdot \frac{\partial u}{\partial t} dA$$

$$F_D = -\rho \cdot G_1 \cdot \frac{du}{dt}$$

2. In order to be able to calculate the frictional force, first the tangential velocity component for a viscous fluid must be calculated. For this, an infinitesimal part of the body is considered. This part is assumed to be an infinitely extended, planar area. The tangential velocity component of an infinitely extended area, which executes translational oscillations in its plane in a viscous fluid, amounts to:

$$v_{t,zF} = u \cdot e^{\frac{n}{\delta}(1-i)}$$

In such case, $\eta$ is the viscosity, $\rho$ the density and $\delta$ the penetration depth of the transverse wave and is defined by the formula:

$$\delta = \sqrt{\frac{2\eta}{\omega\rho}}.$$

The tangential velocity of a viscous fluid, thus, decreases toward the surface of the body according to the formula:

$$v_{t,zF} = v_{t,iF} \cdot \left(1 - e^{\frac{n}{\delta}(1-i)}\right),$$

since the viscosity of the fluid influences the tangential velocity component toward the surface of the body.

The frictional force, which acts on the surface of the body per unit length, is then:

$$F_R = \eta \cdot \frac{dv_{t,zF}}{dn}\bigg|_{n=0}$$

$$F_R = -G \cdot \left(u \cdot \sqrt{\frac{\omega\rho\eta}{2}} - i \cdot u \cdot \sqrt{\frac{\omega\rho\eta}{2}}\right).$$

With $$i = \frac{s}{\omega},$$

it follows that:

$$F_R = -G \cdot \left(u \cdot \sqrt{\frac{\omega\rho\eta}{2}} - \frac{du}{dt} \cdot \sqrt{\frac{\rho\eta}{2\omega}}\right)$$

The total frictional force results then from integrating the above set-forth force over the surface of the body:

$$F_R = \int -G \cdot \left(u \cdot \sqrt{\frac{\omega\rho\eta}{2}} - \frac{du}{dt} \cdot \sqrt{\frac{\rho\eta}{2\omega}}\right) dA$$

$$F_R = -G_2 \cdot \left(u \cdot \sqrt{\frac{\omega\rho\eta}{2}} - \frac{du}{dt} \cdot \sqrt{\frac{\rho\eta}{2\omega}}\right)$$

The total force acting on the body from the fluid results from summing the compressive force and the frictional force. In such case, the direction of the individual forces is, in each case, taken to be positive:

$$F_F = F_D + F_R$$

$$F_F = m_F \cdot \frac{du}{dt} + d_F \cdot u$$

In such case, $m_F$ is to be interpreted as supplementally on-coupling mass and $d_F$ as supplementally acting damping:

$$m_F = G_1 \cdot \rho + G_2 \cdot \sqrt{\frac{\rho\eta}{2\omega}}$$

$$d_F = G_2 \cdot \sqrt{\frac{\omega \rho \eta}{2}}$$

The differential equation of the vibronic sensor becomes, thus, an equation of second order:

$$U_e^* \omega_0^2 = \ddot{\phi} + 2^* D^* \omega_0^* \dot{\phi} + \omega_0^{2*} \phi.$$

With the eigen angular frequency $\omega_0$ and Lehr's damping regression analysis measure D, the following formulas result:

$$\omega_0^2 = \frac{c(T)}{m_S + m_F}$$

$$D = \frac{d_S + d_F}{2*(m_S + m_F)*\omega_0}$$

$G_1$ and $G_2$ are factors, which depend exclusively on the geometry of the oscillatable body. The stiffness of the system is given by c(T), $m_S$ is the mass, $d_S$ the damping of the freely oscillating system. Via known parameter estimation methods, the variables, Lehr's damping measure D and the eigenfrequency $\omega_0$ can be ascertained. Furthermore, then the fluid parameters, density ρ, viscosity η and temperature T, can be estimated.

The parameter estimation methods have, partially, quite old sources. Thus, the theory for LS and RLS was initially derived by Carl Friedrich Gauss in his publication "Theoria Combinationis obervationum erroribus minimis obnoxiae I, II" of 1821-1823. Today, the method of least squares LS is a mathematical standard method, which is used for data approximation or regression analysis in all of the sciences. The Kalman filter was published by Rudolf Emil Kalman with the title "A new approach to linear filtering and prediction problems" in 1960. The greatest field of use of the Kalman standard filter is for smoothing measurement signals, for example, in order to compensate for noise in the measurement signals. Good overviews of the development of parameter estimation methods can be found in numerous articles and books.

An advantageous embodiment of the method of the invention provides that a quality criterion is ascertained, which describes the quality of the virtual output signal relative to the real output signal based on the output sequence of the oscillatable system, and wherein at least one of the desired process- or system specific parameters is provided, as soon as the quality criterion lies in the predetermined tolerance range of a predetermined value for the quality criterion. The quality criterion is, for example, the sum of the squares. In this case, the quality criterion is preferably zero.

Moreover, it is provided that the changing of the process- or system specific parameters is performed via an adaptation algorithm, which varies the process- and/or system specific parameters until the deviation between the virtual output signal and the real output signal, respectively the ascertained quality criterion and the predetermined quality criterion, lies in the predetermined tolerance range and the deviation reaches preferably a minimum.

Preferably used in connection with the invention as a mathematical model, in which the oscillatable system is described as a linear or non-linear system, is a description of the oscillatable system in a state space. Used as method for describing the oscillatable system in the state space is the extended Kalman filter, the unscented Kalman filter or a subspace method.

Applied as mathematical model, in which the oscillatable system is described as a linear system, is preferably a parameter estimation method. The parameter estimation method describes the relationship between the input signal and the output signal using transfer functions or transfer matrices.

Moreover, an alternative embodiment of the method of the invention provides that used as parameter estimation method is preferably the method of least squares, the generalized LS method, the RLS method, the method of auxiliary variables or the method of maximum probability.

As already earlier mentioned, determined as process- and/or system specific parameters are temperature, viscosity and/or density of the medium and/or the fill level of the medium in a container.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1:
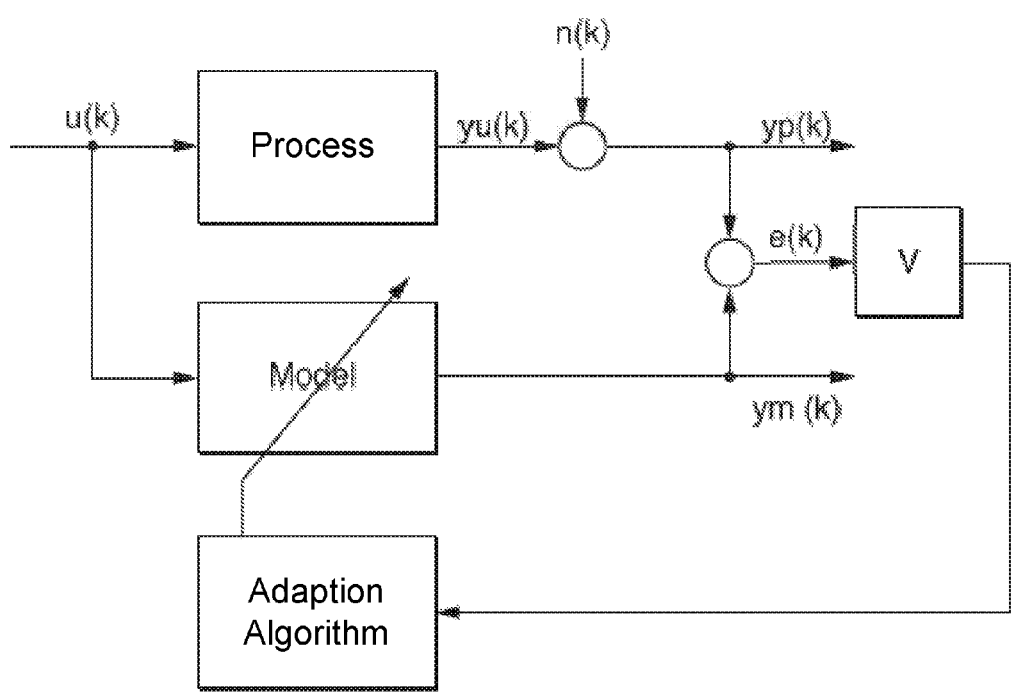
FIG. 1 is a block diagram illustrating the method of the invention.

FIG. 1 shows a block diagram, which illustrates the method of the invention for determining and or monitoring at least one process- and/or system specific parameter. For this, an oscillatable system is provided, which, at least at times, interacts with a medium, respectively fluid, located in a container. The oscillatable system in contact with the fluid is represented in FIG. 1 by the block "Process".

The oscillatable system is excited to oscillate via an analog input signal. The real output signal is ascertained as output signal of the oscillatable system, then digitized, so that a real output sequence yu(k) is produced. Usual disturbance variables n(k) are taken into consideration, so that the real output sequence yp(k) results.

In parallel therewith, the real input signal is digitized, and a digital input sequence u(k) is produced. The digital input sequence u(k) is fed to a function block, Model, which provides at least one mathematical model of the oscillatable system in interaction with the medium. The mathematical model is defined by a number of process- and/or system specific parameters. Via the mathematical model, a virtual output sequence ym(k) is produced. Then, the virtual output sequence ym(k) is compared with the real output sequence yu(k), respectively yp(k). In the case of a deviation e(k), at least one of the process- and/or system specific parameters of the mathematical model is adaptively changed, until the deviation e(k) between the virtual output signal ym(k) and the real output signal yu(k), respectively yp(k), of the oscillatable unit lies within a predetermined tolerance range. Then, at least one of the process- and/or system specific parameters is provided.

In the following, an embodiment of the model building is described. For forming the mathematical model, the equations of hydrodynamics are taken into consideration. Especially, it the state of motion of an oscillatable element oscillating in a medium can be described with five equations:
the Euler equations
the continuity equation
the adiabatic equation In such case, all variables refer to certain points in space and not to certain liquid particles. A liquid particle is defined as an infinitesimal volume of a liquid, whose volume is small relative to the total volume. Furthermore, the intermolecular distances are assumed to be large relative to the infinitesimal volume of a liquid particle.

The following assumptions hold for an ideal fluid:
Processes of energy dissipation are not taken into consideration. Especially, it is assumed, in such case, that the fluid has no viscosity and that no heat exchange occurs between the liquid particles. The motion of the liquid particles occurs adiabatically and $$\frac{ds}{dt} = 0,$$

wherein s is the entropy and t the time.
continuity equation (mass balance):

$$\frac{\partial \rho}{\partial t} + div(\rho v) = 0$$

Euler equation:

$$\frac{\partial v}{\partial t} + (v\nabla)v = -\frac{1}{\rho} grad(p)$$

thermodynamic relationship:

$$dw = T\ ds + V\ dp \xrightarrow{s=const} dw = V\ dp = \frac{dp}{\rho}$$

Euler equation:

$$\frac{\partial v}{\partial t} + (v\nabla)v = -grad(w)$$

In the case of an ideal fluid, which is described by the thermodynamic relationship:

$$\frac{grad(v^2)}{2} = v \times rot(v) + (v\nabla)v$$

the Euler equation:

$$\frac{\partial v}{\partial t} + (v\nabla)v = -grad(w),$$

can be expressed in a variant, which contains exclusively velocities:

$$\frac{\partial}{\partial t} rot(v) = rot(v \times rot(v))$$

In the ideal case, it is further assumed:
that the flow is stationary,
i.e., the flow velocity in each point of the space occupied by the liquid is constant with time,
and that the velocity is a pure point function.
and that a potential flow is involved,
i.e., the flow is eddy free flow and
the stationary flow about any body is a potential flow, when the flow inflowing from infinity is homogeneous (Thomson's theorem).
In reference to the assumption of an ideal fluid, the following points must be taken into consideration:
The findings in the case of considering an ideal fluid are in the real case only limitedly applicable;
The flow can shed on the surface of a body around which it is flowing. The means that
a tangential instability surface arises, on which the flow velocity is unsteady, and
that the solution of the equations for ideal liquids is not unique.
There are in the reality no ideal liquids. Rather:
Each fluid possesses a viscosity.
Due to the viscosity of a fluid, the solution is unique.
Viscosity plays a special role in the vicinity of the surface.
However, the solutions of the equations of motion for a steady stationary potential flow are helpful in some cases:
The flow around just any body has nothing in common with a potential flow around such.
Flows around streamlined bodies deviates scarcely from the potential flow around such bodies.
Exclusively in the vicinity of the surface and in a narrow region of the wake behind a body, there is no potential flow.
In the following, small oscillations of a body immersed in an ideal fluid will be considered.
For this, the individual terms of the Euler equation are considered:
Under the assumption that the adiabatic movement (entropy (s)) is constant, a homentropic motion results, which is described by the following formula:

$$\frac{\partial v}{\partial t} + (v\nabla)v = -grad(w)$$

The velocity undergoes noticeable change in distances of the order of magnitude of the dimensions of the (I)→

$$v\nabla \approx \frac{u}{l}$$

The velocity is determined by the velocity of the body→

$$(v\nabla)v \approx \frac{u^2}{l}$$

The derivative of the velocity with respect to time is $$\frac{\partial v}{\partial t} = \omega u$$

and with $\omega \approx u/a$ it follows that $$\frac{\partial v}{\partial t} = u^2/a.$$

If the oscillation amplitude (a) is much smaller than the dimension of the body (I), then it follows that:

$$\frac{\partial v}{\partial t} = -grad(w)$$

By forming the curl it follows that:

$$\frac{\partial}{\partial t} rot(v) = 0 \rightarrow rot(v) = const.$$

Since in the case of an oscillatory motion, the time average value of the velocity is zero, it follows that:
rot(v)=0

The flow of a liquid, which executes small oscillations, is, to a first approximation, a potential flow.
Any eddy free vector field can be represented as a gradient of a scalar.
v=grad(φ)

By insertion into the continuity equation, the Laplace equation follows:
Δφ=0

With the Euler equation, the first integral of the equation of motion of a potential flow follows:

$$grad\left(\frac{\partial \varphi}{\partial t} + \frac{v^2}{2} + w\right) = 0$$

Real fluids have a certain viscosity. In this case, the following points must be taken into consideration:
The energy dissipation as a result of friction effects
The Navier-Stokes equation:

$$\frac{\partial v}{\partial t} + (v\nabla)v = -\frac{1}{\rho}grad(p) + \frac{\eta}{\rho}\Delta v$$

Any flow is determined by three parameters:
kinematic viscosity (ν)
velocity (u)
geometrical dimension of the body (l)
The dimensionless combination of the three parameters leads to the definition of the Reynolds number:

$$\frac{u \cdot l}{\nu} = \frac{\rho \cdot u \cdot l}{\eta}$$

Estimating the terms of the Navier-of Stokes equation:

$$\frac{\partial v}{\partial t} + (v\nabla)v = -\frac{1}{\rho}grad(p) + \frac{\eta}{\rho}\Delta v$$

The velocity experiences noticeable change in distances of the order of magnitude of the dimension of the body (I)→

$$v\nabla \approx \frac{u}{l}.$$

The velocity is determined by the velocity of the body→

$$(v\nabla)v \approx \frac{u^2}{l}$$

Furthermore, $$\frac{\eta}{\rho}\Delta v \approx \frac{\eta \cdot u}{\rho \cdot l^2}.$$

The ratio of the two terms yields the Reynolds number:

$$\frac{(v\nabla)v}{\frac{\eta}{\rho}\Delta v} \approx \frac{u \cdot \rho \cdot l}{\eta}$$

For small Reynolds numbers, consequently, the term (v∇)v can be neglected compared with $$\frac{\eta}{\rho}\Delta v.$$

Thus, the Navier-Stokes equation for a stationary flow leads to a linear equation of motion:

$$-\frac{1}{\rho}grad(p) + \frac{\eta}{\rho}\Delta v = 0$$

This equation determines together with the continuity equation the flow of the fluid completely.

In the following, small oscillations of an unbounded planar area in an incompressible viscous fluid will be considered:
The flow, which arises in the case of oscillations of a solid body in a viscous liquid, includes a whole series of characteristic, special features.
This will be explained in the following based on a simple example:
It is assumed that an incompressible liquid comes in contact with an unbounded planar area, which executes in its plane a simple harmonic oscillation with the frequency ω.

$$u = cos(wt) = Re\{u_0 e^{-j\omega t}\}$$

For x=0, the following boundary conditions hold: $v_y = u$; $v_{x,z} = 0$

Continuity equation (incompressible fluid):

From symmetry, it is clear that all variables depend only on x (and on the time)

$$div(v) = 0 \rightarrow \frac{\partial v_x}{\partial x} = 0 \rightarrow v_x = const \stackrel{RB}{\rightarrow} v_x = 0$$

Navier-Stokes equation:

$$\frac{\partial v}{\partial t} + (v\nabla)v = -\frac{1}{\rho}grad(p) + \frac{\eta}{\rho}\Delta v$$

All variables are independent of y and z.

$$(v\nabla)v = v_x \frac{\partial}{\partial x} v \stackrel{RB}{\rightarrow} (v\nabla)v = 0$$

$$\frac{\partial v}{\partial t} = -\frac{1}{\rho}grad(p) + \frac{\eta}{\rho}\Delta v$$

Linear equation with x-component equal to zero. Navier-Stokes equation becomes a one-dimensional heat conduction equation $$\frac{dp}{dx} = 0 \rightarrow p = const$$

$$\frac{\partial v}{\partial t} = \frac{\eta}{\rho}\Delta v \rightarrow \frac{\partial v}{\partial t} = \nu \frac{\partial^2 v}{\partial x^2}$$

The velocity of the fluid then becomes $$v = u_0 e^{-i\omega t} e^{\frac{x}{\delta}(1-j)} \text{ with } \delta = \sqrt{\frac{2\eta}{\omega\rho}}.$$

In a viscous liquid, transverse waves can occur.

The velocity $v_y = v$ is perpendicular to the propagation direction of the wave.

The damping of the wave occurs exponentially as a function of the penetration depth $\delta$.

The penetration depth decreases with increasing frequency of the wave and increases with increasing viscosity of the liquid.

Navier-Stokes equation:

$$\frac{\partial v}{\partial t} + (v\nabla)v = -\frac{1}{\rho}grad(p) + \frac{\eta}{\rho}\Delta v$$

Estimating the terms:

$$(v\nabla)v \approx \frac{v^2}{l} \approx \frac{a^2\omega^2}{l}$$

$$\frac{\partial v}{\partial t} \approx v\omega \approx a\omega^2$$

For a≪l, the term $(v\nabla)v$ can be neglected. The Reynolds number does not, in such case, have to be small.

$$\frac{\partial v}{\partial t} = -\frac{1}{\rho}grad(p) + \frac{\eta}{\rho}\Delta v$$

By forming the curl on both sides of this equation, one obtains:

$$\frac{\partial}{\partial t}rot(v) = \frac{\eta}{\rho}\Delta rot(v)$$

The equation of motion of a body, whose oscillation amplitude is small compared with its geometric dimensions, is a type of heat conduction equation:

$$\frac{\partial}{\partial t}rot(v) = \frac{\eta}{\rho}\Delta rot(v)$$

The curl of the velocity decays into the interior of the liquid.

The motion of the liquid brought about by the oscillations of the body is flow containing an eddy in a certain layer around the body. At greater distance, this rapidly transfers into a potential flow. The penetration depth of the eddy flow is $\delta$.

The motion of the incompressible fluid outside this thin layer can, thus, be described with the following equations:

rot(v)=0; div(v)=0

It follows therefrom that $\Delta v=0$.

The Navier-Stokes equation transforms because of this into the Euler equation.

The liquid flows thus overall, except in the layer on the surface of the body, as an ideal liquid.

Since the boundary layer around the body is thin, one would, in the case of the solution of the equations rot(v)=0, div(v)=0 for determining the flow in the predominant part of the liquid take the same boundary conditions, which must be fulfilled on the surface of the body, i.e., the flow velocity would equal the velocity of the body.

The solutions of the equations of motion for an ideal liquid can, however, not satisfy these conditions.

One can place these conditions only on the normal component of the flow velocity on the surface of the body.

The equations for an ideal fluid are, indeed, not applicable in the boundary layer around the body. Since, however, the velocity distribution won in the case of their solution already satisfies the needed boundary conditions for the normal component of the velocity, the true behavior of this component in the vicinity of the surface of the body can have no essential, special features. Only the resulting tangential velocity component is not correct.

Calculating the forces, which an ideal fluid exerts on an elliptical cylinder.

Assumption: Incompressibility

Incompressibility is present, when the Mach number $$\left(Ma = \frac{v}{c}\right) \quad 5$$

is very much less than one.

This amounts for the sensor in a silicone oil of 5000 mPa s to $Ma \approx 94 \cdot 10^{-6} \ll 1$.

The flow of an incompressible ideal liquid, which executes small oscillations, is to a first approximation a potential flow. The following equations hold:

div(v)=0                                                        continuity equation rot(v)=0                                                             Euler-equation Each eddy free vector field can be represented as a gradient of a scalar.

v=grad(φ)

Figure 3:
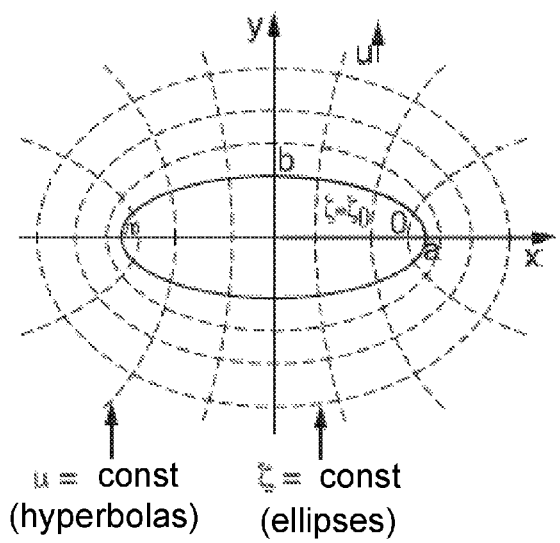
FIG. 3 is a representation of an elliptical cylinder in the elliptical coordinate system.

In the following, a floatable limit level detector, e.g. that of the applicant manufactured and sold under the mark Liquiphant, particularly its fork tines coming in contact with the medium, will now be considered in greater detail. The fork tines can approximately be described as elliptical cylinders. In the following, the forces will be calculated, which are exerted by an ideal fluid on an elliptical cylinder. FIG. 3 shows an elliptical cylinder in the elliptical coordinate system.

The velocity potential around the elliptical cylinder is:

$$\varphi = -u \cdot a \cdot e^{\xi_0 - \xi} \cdot \frac{\cos^2(\mu)}{\sin(\mu)}$$

Then the velocity of the fluid is:

$$v = A \cdot \vec{e}_\xi + B \cdot \vec{e}_\mu$$

$$A = \frac{u \cdot a \cdot e^{\xi_0 - \xi} \cdot \cos^2(\mu)}{\sin(\mu)\sqrt{c^2(\cosh^2(\xi) - \cos^2(\mu))}}$$

$$B = \frac{u \cdot a \cdot e^{\xi_0 - \xi} \cdot \cos^2(\mu)}{\sin(\mu)\sqrt{c^2(\cosh^2(\xi) - \cos^2(\mu))}} \left(1 + \frac{1}{\sin^2(\mu)}\right)$$

From $\Delta\varphi = 0$, the Euler equation becomes:

$$grad\left(\frac{d\varphi}{dt} + \frac{v^2}{2} + \frac{p}{\rho}\right) = 0 \rightarrow \frac{d\varphi}{dt} + \frac{v^2}{2} + \frac{p}{\rho} = f(t)$$

Additionally, it must be taken into consideration that the coordinate origin is in the center of the ellipse and moves with time with the velocity (u) of the body. For this reason, the total differential is formed:

$$\frac{d\varphi}{dt} = \frac{\partial \varphi}{\partial u}\frac{du}{dt} - u\nabla\varphi$$

The pressure on the surface of the cylinder is then:

$$p|_{\xi=\xi_0} = \rho\left(-\frac{v^2}{2} + a\frac{\cos^2(\mu)}{\sin(\mu)}\frac{du}{dt} + u\nabla\varphi\right)$$

The velocity proportional terms deliver no contribution to the force (in an ideal fluid there is no energy dissipation→no force can act on a uniformly moved body)

$$p|_{\xi=\xi_0} = \rho \cdot a\frac{\cos^2(\mu)}{\sin(\mu)}d$$

The force results from the integral of the pressure over the cylindrical surface $$F = \int p|_{\xi=\xi_0} dA = \int \rho \cdot a\frac{\cos^2(\mu)}{\sin(\mu)}\frac{du}{dt}dx$$

In such case, dx is in elliptical coordinates:

$$dx|_{\xi=\xi_0} = -c\cos h(\xi_0)\sin(\mu)d\mu = -a\sin(\mu)d\mu$$

It follows therefrom that the force on the cylinder amounts to:

$$F = \rho a^2 \frac{du}{dt}\int_0^{2\pi} \cos^2(\mu) d\mu$$

$$F = \rho a^2 \pi \frac{du}{dt}$$

In contrast to the tangential component, the normal velocity component is not influenced by the viscosity.

The tangential velocity component must change quickly in the thin boundary layer. The pace of the change can easily be determined. If one considers a portion of the surface of the body, whose dimensions are small compared with the dimensions of the body, then one can consider this portion as approximately planar.

Due to this, the results calculated above for a planar area can be applied.

The tangential velocity component in an ideal fluid amounts to:

$$v_{t,moved} = \frac{u \cdot a \cdot e^{\xi_0 - \xi} \cdot \cos^2(\mu)}{\sin(\mu)\sqrt{c^2(\cosh^2(\xi) - \cos^2(\mu))}}\left(1 + \frac{1}{\sin^2(\mu)}\right)\vec{e}_\xi$$

The tangential velocity component was calculated for an elliptical cylinder moving in a liquid at rest.

For other calculations, this must be converted for a resting elliptical cylinder, which is exposed to a potential flow.

The problem of the body moved in the liquid is completely equivalent to the problem of flow around a fixed body in a liquid flow, which at infinity has the given velocity u. The velocity distribution for the first problem (moved body in a liquid) results from the solution of the second problem (resting body in a liquid flow) simply by subtracting the velocity u.

Thus, the tangential velocity component of a resting elliptical cylinder located in a potential flow is:

$$v_{t,resting} = v_{t,moved}(1 + A)$$

$$A = \frac{a \cdot e^{\xi_0 - \xi} \cdot \cos^2(\mu)}{\sin(\mu)\sqrt{c^2(\cosh^2(\xi) - \cos^2(\mu))}} \left(1 + \frac{1}{\sin^2(\mu)}\right)$$

The tangential velocity component must, toward the surface, correspond to the velocity of the body. Since the body is at rest, the tangential velocity component in the thin edge zone toward the surface of the body must become zero.

As previously described, the tangential velocity component of a plane oscillating in a viscous fluid decreases exponentially with the penetration depth $\delta$ in normal direction.

The velocity of a viscous liquid arising when a planar area executes translational oscillations in its plane amounts to:

$$v = u_0 e^{-i\omega t} e^{\frac{x}{\delta}(1-j)} \text{ with } \delta = \sqrt{\frac{2\eta}{\omega \rho}}$$

From this, it follows that the tangential velocity component calculated for an ideal fluid must decrease for a viscous fluid according to the following relationship:

$$v_t = v_{t,resting}\left(1 - e^{\frac{\xi_0 - \xi}{\delta}(1-j)}\right)$$

The frictional force per unit area, which acts on a planar area oscillating in a viscous fluid, amounts to:

$$F = \eta \frac{dv_t}{dn}\bigg|_{n=0}$$

This equation can also be used for calculating the force, which acts on the elliptical cylinder due to friction from the fluid. In such case, n is the unit vector in the normal direction of the cylinder. In elliptical cylindrical coordinates, there results:

$$F = \eta \frac{dv_t}{d\xi}\bigg|_{\xi=\xi_0}$$

Thus, the force per unit area is:

$$F = (1 + B)\left(\sqrt{\frac{\omega \rho \eta}{2}} u - \sqrt{\frac{\omega \rho \eta}{2}} iu\right)$$

$$B = \frac{\cos(\mu)}{\sqrt{1 + (m^2 - 1)\cos^2(\mu)}} \left(1 + \frac{1}{\sin^2(\mu)}\right)$$

If one separates the real- and imaginary parts of the force F, one obtains:

$$F = (k_1 - ik_2)u$$

$$F = \left(k_1 - \frac{s}{\omega}k_2\right)u = k_1 u - k_2 \frac{1}{\omega} \frac{du}{dt}$$

$$k_1 = \sqrt{\frac{\omega \rho \eta}{2}} (1 + B)$$

$$k_2 = \sqrt{\frac{\rho \eta}{2\omega}} (1 + B)$$

$$B = \frac{\cos(\mu)}{\sqrt{1 + (m^2 - 1)\cos^2(\mu)}} \left(1 + \frac{1}{\sin^2(\mu)}\right)$$

For calculating the force, which acts on the total elliptical cylinder, the calculated force per unit length must be integrated over the entire surface.

The oscillation direction points in Cartesian coordinates in the y-direction. Thus, the acting frictional force calculates to:

$$F = \int F dy$$

$$y = c\sinh(\xi)\sin(\mu)$$

$$F|_{\xi=\xi_0} = 2\int_{\frac{1}{2}\pi}^{\frac{3}{2}\pi} Fb\cos(\mu)\,d\mu$$

This results in a total force of:

$$F = 2bX\left(\sqrt{2\omega\rho\eta}\, u + \sqrt{\frac{\omega\rho\eta}{2}} \frac{du}{dt}\right)$$

$$X = 1 - \frac{E\left[1 - \frac{1}{m^2}\right] - K\left[1 - \frac{1}{m^2}\right]}{m(m^2 - 1)}$$

K=complete elliptic integral of the first kind
E=complete elliptic integral of the second kind As result, there is one term proportional to the velocity and one term proportional to the acceleration.

The velocity proportional term can be interpreted as a supplementally acting damping:

$$d_F = 2 \cdot l \cdot b \cdot X \cdot \sqrt{2\omega\rho\eta}$$

The acceleration proportional term can be interpreted as a coupling of mass.

$$m_F = 2 \cdot l \cdot b \cdot X \cdot \sqrt{\frac{2\rho\eta}{\omega}} + l \cdot \rho \cdot a^2 \cdot \pi$$

Figure 2:
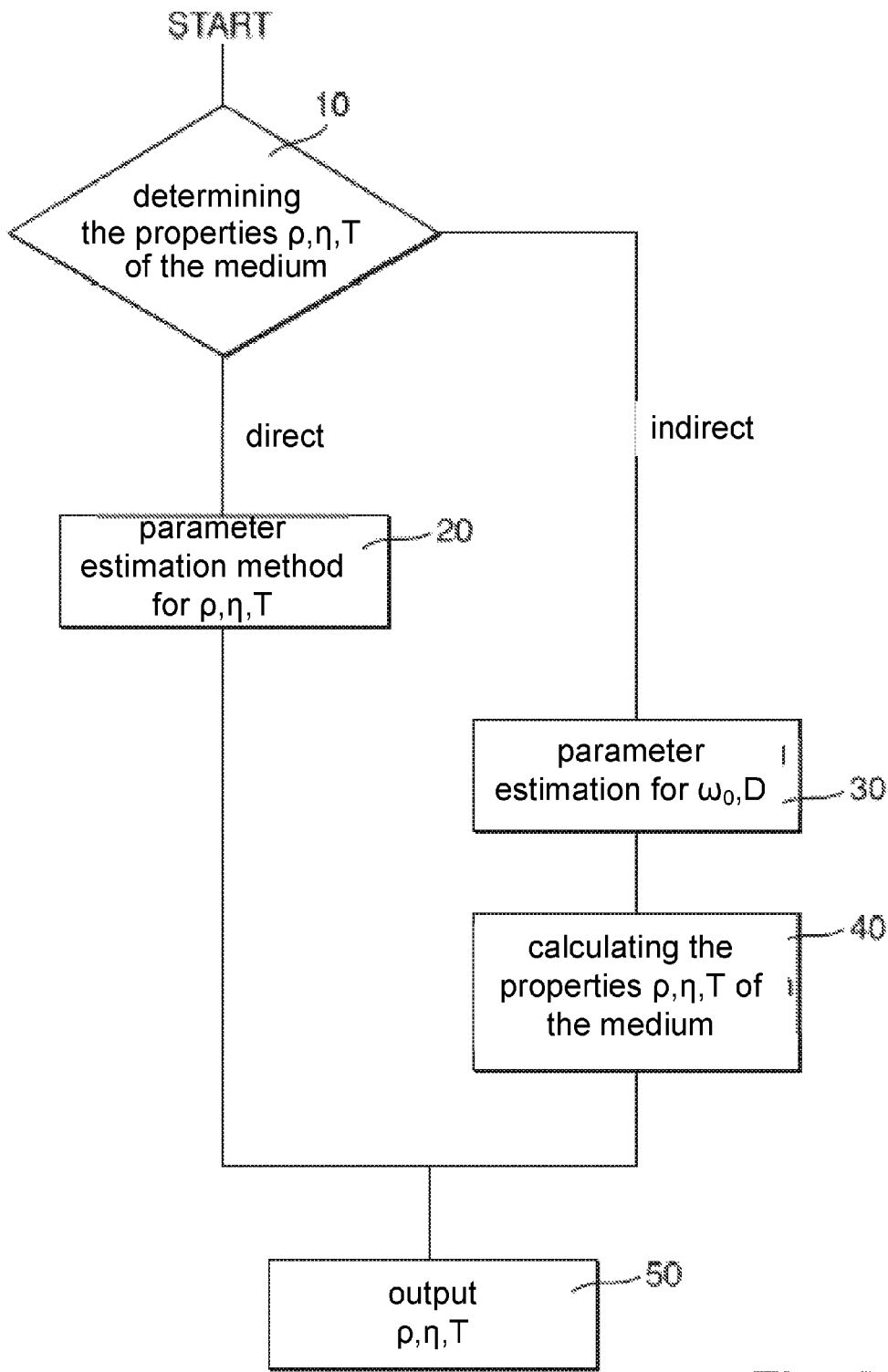
FIG. 2 is a flow diagram illustrating method steps of the method of the invention.

FIG. 2 shows a flow diagram, which illustrates the method steps of the method of the invention. After starting the method, it is decided at program point 10, whether the properties of the medium, respectively the process specific parameters ρ, η, T, are to be ascertained directly or indirectly via a parameter estimation method. If the direct path is selected, then the parameter estimation of the process specific parameters ρ, η, T occurs at program point 20.

If the indirect path is selected, then at program point 30 a parameter estimation of Lehr's damping measure D and the eigen angular frequency $\omega_0$ is performed. Then, at program point 40, calculation of the properties of the medium, respectively the process specific parameter p, n, T, is performed. The required process specific parameters ρ, η, T are output at program point 50.

The invention claimed is:

1. A method for determining and or monitoring at least one process- and/or system specific parameter of an oscillatable system of a vibronic sensor in automation technology, which oscillatable system interacts at least at times with a medium located in a container, the method comprising method steps as follows:
    exciting the oscillatable system to oscillate via a real input signal;
    ascertaining the real output signal of the oscillatable system;
    producing a digitized real output signal and a real output sequence (yu(k));
    producing a digitized real input signal and a digital input sequence (u(k));
    feeding the digital input sequence (u(k)) to a function block (model), which provides at least one mathematical model, which describes the oscillatory behavior of the oscillatable system in interaction with the medium, wherein the mathematical model is defined by a multitude of process- and/or system specific parameters;
    producing a virtual output sequence (ym(k)) via the mathematical model;
    comparing the virtual output sequence (ym(k)) with the real output sequence (yu(k));
    in the case of a deviation (e(k)), between the virtual output sequence (ym(k)) and the real output sequence (yu)k)) of the oscillatable unit, at least one process- and/or system specific parameter of the mathematical model is adaptively changed, until said deviation lies within a predetermined tolerance range; and
    at least one of the process- and/or system specific parameters is provided.

2. The method as claimed in claim 1, wherein:
    a quality criterion (V) is ascertained, which describes the quality of the virtual output signal relative to the real output signal based on the output sequence (yu(k), ym(k)) of the oscillatable system; and
    at least one of the process- or system specific parameters is provided, as soon as the quality criterion (V) lies in the predetermined tolerance range of a predetermined desired value for the quality criterion (V).

3. The method as claimed in claim 1, wherein:
    the changing of the process- and/or system specific parameter is performed via an adaptation algorithm, which varies the process- and/or system specific parameter until the deviation between the virtual output signal and the real output signal, respectively the ascertained quality criterion (V) and the predetermined quality criterion (V), lies in the predetermined tolerance range and the deviation reaches preferably a minimum.

4. The method as claimed in claim 1, wherein:
    used as mathematical model, in which the oscillatable system is described as a linear or non-linear system, is a description of the oscillatable system in a state space.

5. The method as claimed in claim 4, wherein:
    used as method for describing the oscillatable system in the state space is the extended Kalman filter, the unscented Kalman filter or a subspace method.

6. The method as claimed in claim 1, wherein:
    applied as mathematical model, in which the oscillatable system is described as a linear system, is preferably a parameter estimation method, which describes the relationship between the input signal and the output signal using transfer functions or transfer matrices.

7. The method as claimed in claim 6, wherein:
    used as parameter estimation method is preferably the method of least squares, the generalized LS method, the RLS method, the method of auxiliary variables or the method of maximum probability.

8. The method as claimed in claim 1, wherein:
    determined as process- and/or system specific parameter (s) are/is temperature, viscosity and/or density of the medium and/or fill level of the medium in a container.

* * * * *